United States Patent
Kassai et al.

(10) Patent No.: US 6,977,501 B2
(45) Date of Patent: Dec. 20, 2005

(54) MRI APPARATUS AND METHOD FOR CALCULATING PREDICTED AND/OR ACTUAL NET ACCUMULATED GRADIENT COIL HEAT AND/OR TEMPERATURE

(75) Inventors: Yoshimori Kassai, Tochigi-ken (JP); Masaaki Yamanaka, Tochigi-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/430,386

(22) Filed: May 7, 2003

(65) Prior Publication Data

US 2004/0017195 A1    Jan. 29, 2004

(30) Foreign Application Priority Data

May 7, 2002    (JP) .............................. 2002-131132

(51) Int. Cl.⁷ .............................................. G01V 3/00
(52) U.S. Cl. ...................................... 324/315; 324/318
(58) Field of Search .............................. 324/307–309, 324/315, 318, 322

(56) References Cited

U.S. PATENT DOCUMENTS

| | | | | | |
|---|---|---|---|---|---|
| 5,025,217 | A | * | 6/1991 | Van Vaals ...................... | 324/322 |
| 5,126,672 | A | * | 6/1992 | Le Roux ...................... | 324/309 |
| 5,132,618 | A | * | 7/1992 | Sugimoto ...................... | 324/318 |
| 5,237,277 | A | * | 8/1993 | Lenz ...................... | 324/322 |
| 5,442,290 | A | * | 8/1995 | Crooks ...................... | 324/309 |
| 5,519,320 | A | * | 5/1996 | Kanayama et al. ........... | 324/309 |
| 6,448,773 | B1 | * | 9/2002 | Zhang ...................... | 324/309 |
| 6,456,076 | B1 | * | 9/2002 | Joseph ...................... | 324/318 |
| 6,516,282 | B2 | * | 2/2003 | Hedlund et al. ............ | 702/132 |
| 6,566,880 | B1 | * | 5/2003 | Kruip et al. ................. | 324/318 |
| 6,636,041 | B2 | * | 10/2003 | Arz et al. ...................... | 324/322 |
| 6,653,835 | B2 | * | 11/2003 | Roeckelein et al. ......... | 324/315 |
| 6,731,113 | B2 | * | 5/2004 | Ham et al. .................. | 324/313 |

FOREIGN PATENT DOCUMENTS

| JP | 05-212012 | * | 8/1993 |
|---|---|---|---|
| JP | 8-592 | | 1/1996 |
| JP | 10-43156 | | 2/1998 |
| JP | 10-43157 | | 2/1998 |
| JP | 10-71131 | | 3/1998 |
| JP | 10-71132 | | 3/1998 |
| JP | 10-225446 | * | 8/1998 |
| JP | 11-76195 | | 3/1999 |
| JP | 2000-23939 | * | 1/2000 |

\* cited by examiner

Primary Examiner—Diego Gutierrez
Assistant Examiner—Dixomara Vargas
(74) Attorney, Agent, or Firm—Nixon & Vanderhye P.C.

(57) ABSTRACT

A magnetic resonance imaging apparatus includes a calculator that calculates the quantity of heat generated (or to be generated) in a gradient magnetic field coil as a function of current supplied (or to be supplied) to the gradient magnetic field coil and at least one other factor such as eddy currents induced in a shield body used for shielding gradient field leakage flux from the imaged volume and/or delayed measurement of actual coil temperature. Such improved more timely temperature prediction and/or measurement is used to effect protective actions to better prevent permanent coil damage due to overheating.

15 Claims, 9 Drawing Sheets

MRI APPARATUS AND METHOD FOR CALCULATING PREDICTED AND/OR ACTUAL NET ACCUMULATED GRADIENT COIL HEAT AND/OR TEMPERATURE

CROSS-REFERENCE TO RELATED APPLICATIONS

This application is based upon and claims the benefit of priority from prior Japanese Patent Application No. P2002-131132 filed on May 7, 2002, the entire contents of which are incorporated herein by reference.

FIELD OF THE INVENTION

The present invention relates to a magnetic resonance imaging apparatus (MRI apparatus) which calculates accumulated heat or temperature of a gradient magnetic field coil.

BACKGROUND OF THE INVENTION

Magnetic resonance imaging involves magnetically nutating nuclear spins of an object placed in a static magnetic field with an RF signal at a Larmor frequency. MR signals emanate therefrom as the nutated spins relax and an image is generated based on the received MR signals. Since large pulses of electrical current are supplied in an MRI pulse sequence to a gradient magnetic field coil in the static magnetic field, mechanical distortion of the gradient magnetic field coil occurs. Such mechanical distortion can generate loud noises during imaging and this can be painful to a patient. However, in recent years, silencing technology has been developed where the gradient magnetic field coil is surrounded by a vacuum vessel and the noise problem is reduced.

In order to perform spatial encoding of the MR signals, an MRI pulse sequence of currents whose rise and fall time is typically several 100 micro seconds and whose magnitude can be about 100 A–200 A, is supplied to the gradient magnetic field coil. High rise/fall pulse speeds and large amplitude current pulses also generate high heat in the coil structures. In order to dissipate (i.e., remove) the accumulated heat, air cooling and water cooling methods can be used together. However, water cooling alone may have to be used for cooling a gradient magnetic field coil that includes a noise-reducing vacuum vessel, because it is difficult to use air cooling in the vacuum vessel.

Recently, high speed imaging methods, such as echo planar imaging (EPI), etc., have been put into practical use by improving the gradient magnetic field power supply. In such high speed imaging methods, due to high power gradient magnetic fields and high speed switching, fast rise/fall large magnitude pulse currents are required. Leakage magnetic fields also increase according to the pulse current magnitude. Generally, in order to shield spurious or leakage magnetic field flux from the imaged volume, active or passive magnetic shielding is used. With active shielding, a reverse current is supplied to an actively shielded gradient coil (ASGC) disposed near the gradient magnetic field coil. With passive shielding, an iron base shield material is typically used.

However, driving currents generated in these gradient magnetic field coils and shielding coils also generate heat. The shielding material itself makes the empty space narrower, which makes it more difficult to dissipate (i.e., remove) the heat. In order to decrease heat generation, it is generally effective to use larger size coil wire to reduce its resistance, or to enlarge a cooling water pipe cross section to increase the speed of flowing coolant. However, since there is only a relatively narrow empty space near the gradient magnetic field coil, it is also difficult to enlarge the coil wire size and/or the cold water pipe size. Thus, cooling by such hardware methods is limited.

If the available hardware cooling is not sufficient for all conditions, it is desirable to observe the gradient magnetic field coil temperature, and to stop imaging if the coil temperature rises beyond an allowable maximum value. Conventionally, a coil temperature sensor is attached on the surface of resin surrounding the gradient magnetic field coil. However, since the heat conductivity of the resin is relatively low, it takes some dozens of seconds to measure actual coil temperature changes by such a temperature sensor. That is, the MRI apparatus may be damaged because of the time-delayed response of the coil temperature sensor.

There are also prior art MRI systems which calculate coil temperature based on the current supplied to the gradient magnetic field coil. For example, see Japanese patent documents 10-71131; 10-43156; 10-43157; 10-71132 and/or 8-592.

BRIEF DESCRIPTION OF THE INVENTION

The present invention intends to reduce the above-mentioned problems. In short summary, the calculation of coil temperature based on supplied gradient coil current is supplemented by (a) also accounting for heat generated by eddy currents and/or (b) also using actually measured coil temperature—even though it is time delayed.

According to one aspect of the present invention, a magnetic resonance imaging apparatus includes a gradient magnetic field coil, an RF shield board configured to shield an RF field of a whole body RF coil, an input device configured to input MRI pulse sequence protocol information, a controller configured to control current supplied to the gradient magnetic field coil based on the inputted information, and a calculator configured to calculate the accumulated quantity of heat and/or temperature generated by the current that has been supplied to the gradient magnetic field coil and generated by eddy currents in the RF shield board.

According to another aspect of the present invention, a magnetic resonance imaging apparatus includes a gradient magnetic field coil, a temperature sensor configured to measure gradient magnetic field coil temperature, an input device configured to input MRI pulse sequence protocol information, a controller configured to control current supplied to the gradient magnetic field coil based on the inputted information, and a calculator configured to calculate the accumulated quantity of heat and/or temperature generated by current supplied to the gradient magnetic field coil based at least in part on the measured coil temperature.

According to another aspect of the present invention, a method is used for calculating the accumulated quantity of heat and/or temperature in a magnetic resonance imaging apparatus by generating a gradient magnetic field, shielding leakage magnetic gradient field flux, inputting MRI pulse sequence protocol information, controlling current supplied to the gradient magnetic field coil based on the inputted information, and calculating the accumulated quantity of heat and/or temperature generated by the supplied current to the gradient magnetic field coil and eddy currents in the shield body.

BRIEF DESCRIPTION OF THE DRAWINGS

A more complete appreciation of the invention and many of its attendant advantages will be more readily obtained as the same becomes better understood by reference to the following detailed description of exemplary embodiments when considered in connection with the accompanying drawings. Wherever possible, the same reference numbers will be used throughout the drawings for the same or like parts. In the drawings.

DETAILED DESCRIPTION OF THE INVENTION

Figure 1:
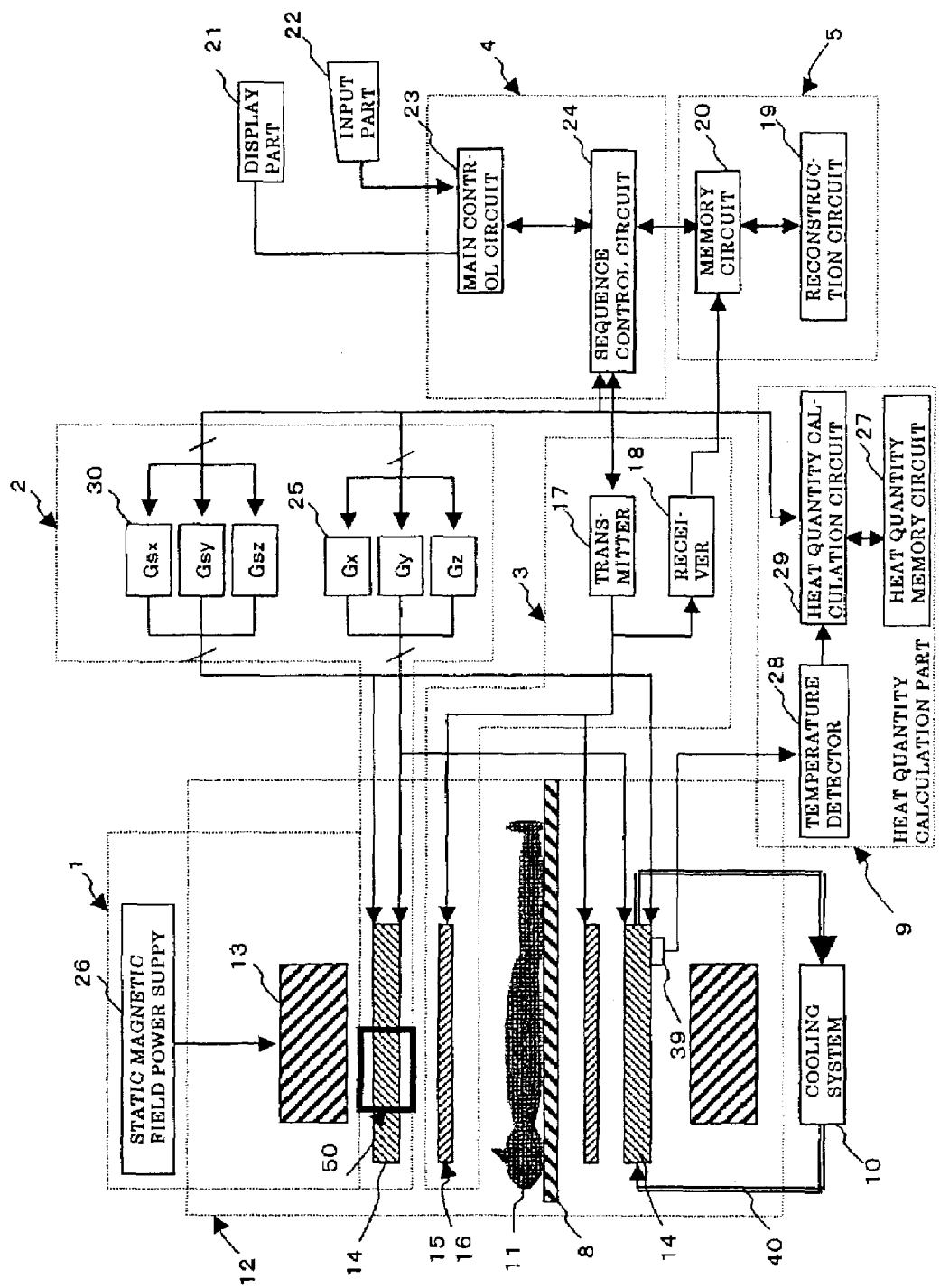
FIG. 1 is a block diagram of an MRI apparatus of a first or a second embodiment.

A first embodiment of the present invention will be explained, referring to FIG. 1 through FIG. 6. FIG. 1 is a block diagram of an MRI apparatus which is conventional and merely one possible example of such conventional MRI systems except for improved heat/temperature calculation features.

A static magnetic field generating part 1 of the MRI apparatus generates a static magnetic field, and a gradient magnetic field generating part 2 generates a gradient magnetic field for positioning an imaging slice in the static magnetic field. A cooling system 10 dissipates (i.e., removes) heat generated by the gradient magnetic field generating part 2, a heat quantity temperature calculation part 9 calculates the quantity of heat (and/or temperature) generated in the gradient magnetic field generating part 2, and a transceiver part 3 transmits RF pulse signals and receives MR signals. A control part 4 controls the MRI apparatus, and a reconstruction part 5 reconstructs an image from the MR signals and stores the image. The MRI apparatus typically includes a bed 8 for carrying a patient 11, an input part 22 and a display part 21. The static magnetic field generating part 1 includes a main magnet 13, such as a super conductive magnet, and a static magnetic field power supply 26 which supplies current to the main magnet 13 to form a powerful static magnetic field around patient 11. The gradient magnetic field generating part 2 includes a gradient magnetic field coil unit 14 having X, Y and Z (i.e., along each of three orthogonal directions) gradient magnetic field coils that generate a succession of temporary gradients in the static magnetic field, and also has an actively shielded magnetic field coil (ASGC) that shields leakage magnetic field flux from the imaged volume. Furthermore, the gradient magnetic field generating part 2 includes a gradient magnetic field power supply 25 that supplies current to each gradient magnetic field coil, and a shield magnetic field power supply 30 that supplies current to the ASGC.

Figure 2:
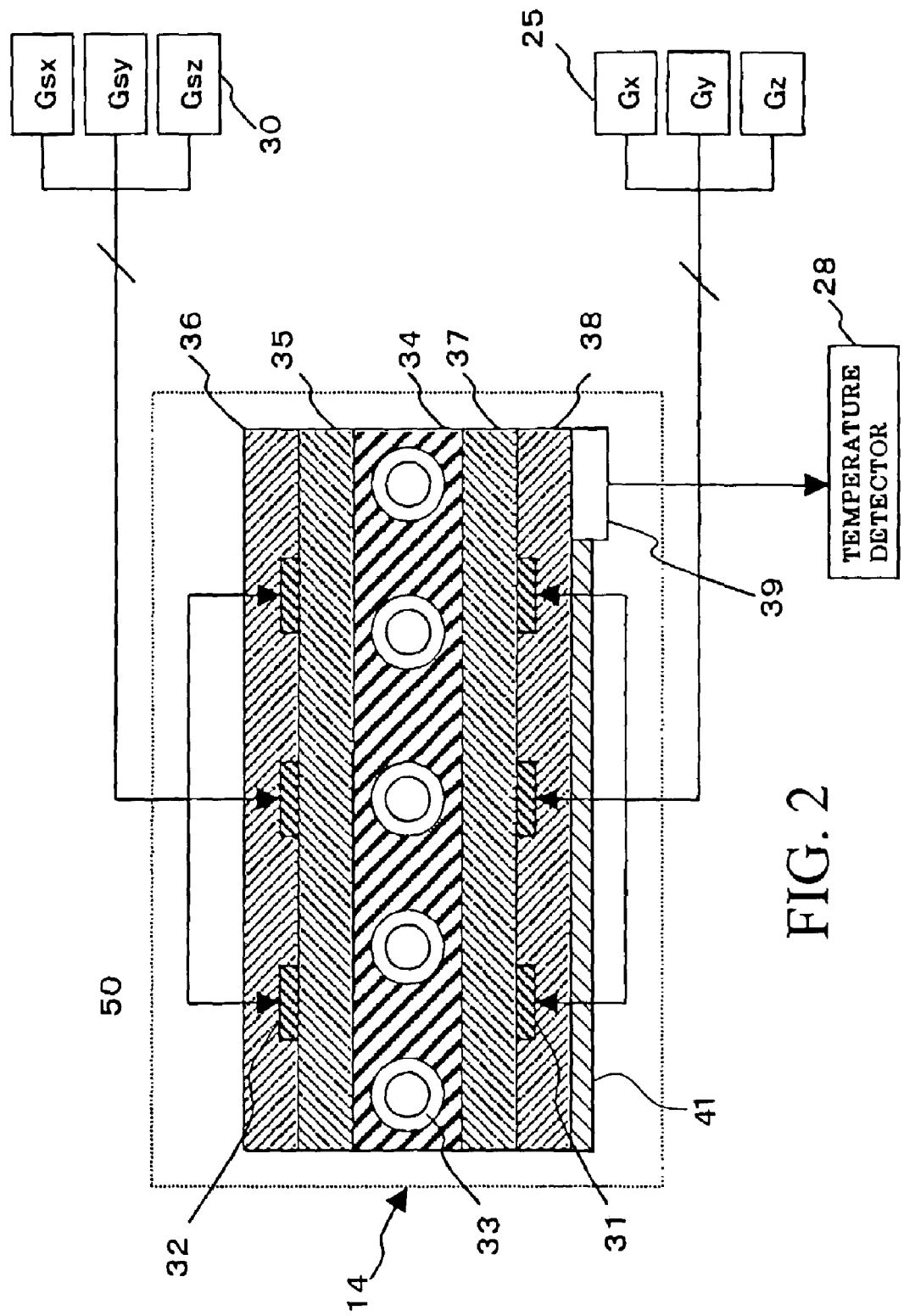
FIG. 2 is a cross sectional view of a gradient magnetic field coil in the first and second embodiment.

FIG. 2 shows an enlarged view of the part surrounded by thick lines in FIG. 1. The gradient magnetic field coil unit 14 may include two flexible printed circuit boards 35 and 37, and resin 34 therebetween. Surfaces of the flexible printed circuit boards 35 and 37 are covered with resins 36 and 38, respectively. On the surface of the flexible printed circuit board 37, the gradient magnetic field coil 31 connected to the gradient magnetic field power supply 25 is provided. On a surface of resin 38, temperature sensor 39 for measuring temperature of the gradient magnetic field coil 31 is provided. On the other hand, on the surface of the flexible printed circuit boards 35, an ASGC 32 is provided, and the ASGC is connected to the shield magnetic field power supply 30. Inside of resin 34, a cold water pipe 33 for removing heat of the gradient magnetic field coil 31 is provided. Furthermore, an RF shield board 41 for shielding leakage magnetic field flux may be installed in parallel to the printed circuit board 35. A gradient magnetic field signal is supplied to the gradient magnetic field power supply 25 from a sequence control circuit 24 of the control part 4, and nuclei within an imaged volume space where a patient is inserted are spatially encoded. That is, by controlling the pulse current supplied to the gradient magnetic field coil 31 in X, Y, and Z dimensions, it is possible to select an arbitrary slice volume for imaging—and to spatially encode the nuclei spins therewithin. The gradient magnetic field of each direction is added to the static magnetic field. The shield magnetic field power supply 30 also supplies predetermined pulse currents to ASGC 32, in order to shield magnetic field flux leaking from gradient magnetic field coil 31 outside the patient. Cooling system 10 and cold water pipe 33 of the gradient magnetic field coil unit 14 are connected with cooling pipe 40, and heat from gradient magnetic field coil 31 is removed with cooling liquid, such as water, which flows inside of cooling pipe 33 and cooling pipe 40. The cooling liquid, warmed by the heat of gradient magnetic field coil unit 14, is carried to cooling system 10 to be cooled back down to a predetermined temperature, and the lowered temperature cooling liquid is then again supplied to gradient magnetic field coil unit 14. The heat quantity/temperature calculation part 9 includes a temperature detector 28 where an analog signal supplied from temperature sensor 39 on the surface of resin 38 covering the gradient magnetic field coil 31, is changed to a digital signal. The heat quantity/temperature calculation includes a heat quantity/temperature calculation circuit 29 (e.g., a programmed processor) which calculates the accumulated net quantity of heat currently still residing in (or temperature of) the gradient magnetic field coil 31, based on the electrical current waveform supplied to the gradient magnetic field coil 31 and also based on the sensed temperature. Furthermore, the heat quantity/temperature calculation part 9 includes a heat quantity memory circuit 27 which stores data, such as allowable heat quantity/temperature of the gradient magnetic field coil 31, the electrical current waveform, the measured temperature, and the result of calculated heat quantity/temperature.

In transceiver part 3, transmitter coil 15 is used for transmitting RF pulses to the patient and receiver coil 16 is used for receiving MR signals and for outputting detected signals. Furthermore, transceiver part 3 includes transmitter 17 and receiver 18 which are connected to transmitter coil 15 and receiver coil 16, respectively. Transmitter coil 15 and receiver coil 16 may be separated from each other as shown in FIG. 1, or may be the same coil. Transmitter 17 is controlled by sequence control circuit 24 to transmit modulated RF pulse current (at the Lamour frequency) to transmitter coil 15. Receiver 18 performs signal processing, such as intermediate frequency transforming, phase detecting, filtering, and A/D converting. Control part 4 includes main control circuit 23 and sequence control circuit 24. Main control circuit 23 includes a CPU and a memory circuit to control the whole apparatus. Main control circuit 23 sends MRI pulse sequence information to sequence control circuit 24. Pulse sequence information includes data such as intensity, period and timing of the current pulses to be supplied to gradient magnetic field coil 31 and transmitter coil 15. Moreover, main control circuit 23 controls display part 21 to display heat quantity/temperature of the gradient magnetic field coil 31 as calculated by the heat quantity/temperature calculation part 9. Main control circuit 23 gives an alarm or stops further imaging when the calculated heat quantity/temperature is over an allowable maximum heat quantity/temperature.

Sequence control circuit 24, equipped with a CPU and a memory circuit, stores pulse sequence information sent from main control circuit 23, and controls gradient magnetic field power supply 25, transmitter 17, and receiver 18 according to the pulse sequence information. Reconstruction part 5 is equipped with reconstruction circuit 19 and memory circuit 20. Reconstruction circuit 19 typically performs 2-dimensional Fourier transformation of the MR signals sent from receiver 18 via sequence control circuit 24, and reconstructs an image (MR image) of real space. Memory circuit 20 stores an MRI image reconstructed by reconstruction circuit 19.

Bed 8 can move patient 11 in a longitudinal body axis direction, and has a structure configured to insert the patient into an opening of main magnet 13. In input part 22, an operation table is equipped with various kinds of switches, a keyboard, a display panel, a mouse, etc., and an operator inputs data such as patient ID, study and protocol information by input part 22. Furthermore, instructions to start imaging, movement of bed 8, etc. are also inputted with input part 22. Control instruction signals are transferred to each part via main control circuit 23. Display part 21 typically includes a TV monitor and a signal conversion circuit that converts signals sent from each part to a TV format signal. On the TV monitor, a reconstructed image and also the calculated accumulated heat quantity then still residing in the gradient coil structure (or temperature) are displayed.

Figure 3:
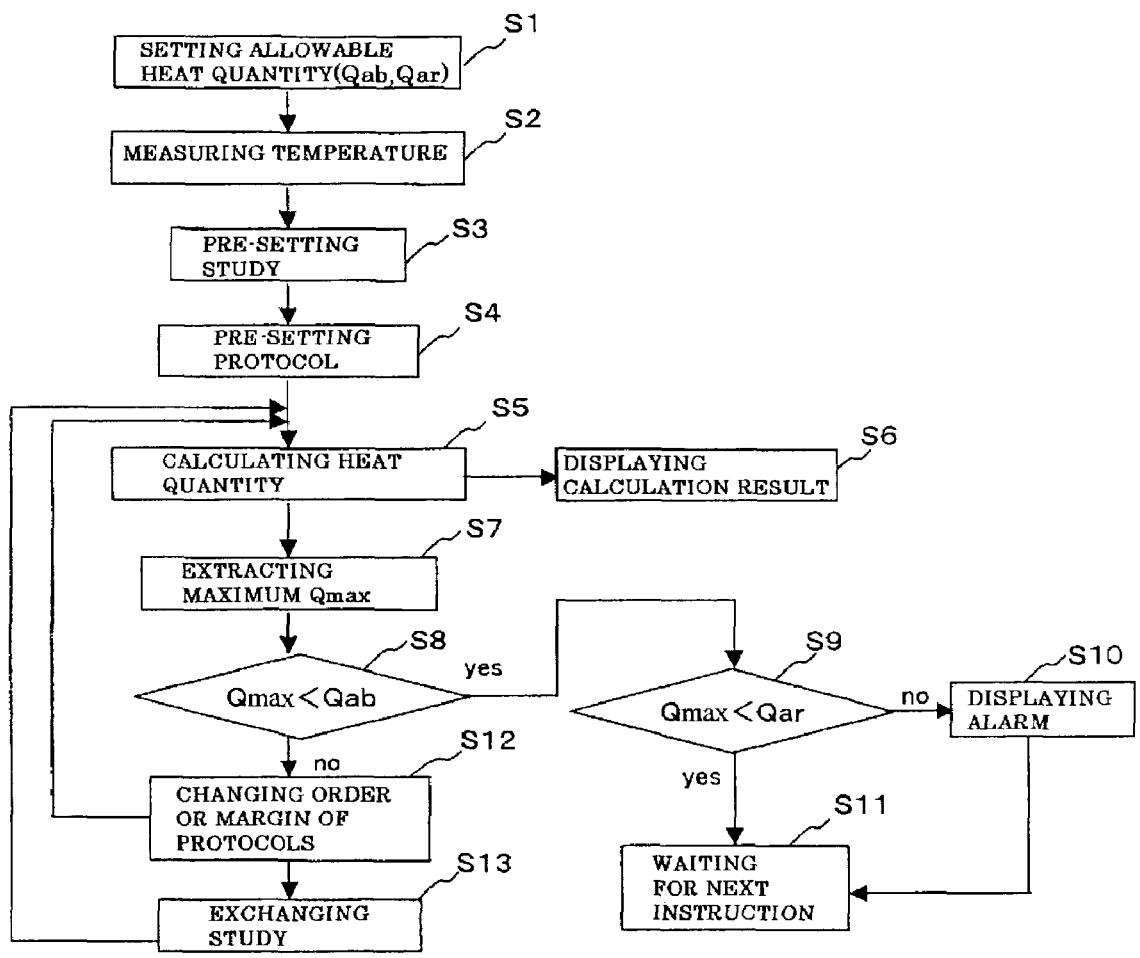
FIG. 3 is a flow chart showing a calculation procedure for the first embodiment.

Referring FIG. 3 to FIG. 6, an exemplary operation of the exemplary MRI apparatus will be explained. FIG. 3 is a flow chart showing an exemplary calculation procedure in the first embodiment. At the time of shipment or installation of the MRI apparatus, the allowable heat quantity/temperature of the gradient magnetic field coil 31 is stored in heat quantity memory circuit 27 (Step S1). The allowable heat quantity/temperature may include two levels. One may be an alarming level Qar and the other may be an aborting level Qab. When the accumulated heat quantity/temperature is over the alarming level Qar, the operator is informed by alarm that the accumulated heat quantity/temperature is close to the limit. The operator is informed that it is necessary to change the study and/or the protocol when the accumulated heat quantity/temperature is over the aborting level Qab—i.e., in order to prevent the MRI apparatus from being damaged due to the accumulated heat. Once the allowable heat quantity is set, it may not be changed in the preferred embodiment. One "Protocol" is defined as one MRI pulse sequence and one "study" is defined as one group of sequential protocols according to an imaging flow for the patient.

le;.5qTemperature sensor 39 near gradient magnetic field coil 31 measures temperature of the gradient magnetic field coil 31 before imaging starts. In this case, a semiconductor element, such as a thermocouple or a thermometer is used as the temperature sensor. When the operator starts a setting by input part 22, the initial temperature is transferred from temperature sensor 39 to temperature detector 28. The temperature measured at this time may show the accumulated, then remaining, heat quantity/temperature associated with imaging of a previous patient. The measured temperature is used to indicate an initial heat quantity/temperature. Temperature detector 28 of heat quantity calculation part 9 changes the measured temperature into a digital signal to be stored in heat quantity memory circuit 27 (Step S2). The operator inputs the patient ID and temporarily sets (pre-sets) an imaging study by input part 22. Typically there are several general types of studies, e.g., abdominal imaging, specific heart imaging, general head imaging, specific head imaging, etc. When the operator inputs the ID of a patient who needs general head imaging and sets the study, protocols for general head imaging are prepared by main control circuit 23 (Step S3). Next, the operator temporarily sets (pre-sets) the desired sequential order of the several selected prepared protocols. Protocols for general head imaging may include FSE (Fast spin echo) with T2 enhancement, a SE (spin echo) with T1 enhancement, 3-dimensional MR angiography, and EPI (echo planar imaging), etc. Since the intensity, period and timing of the current pulses to be transferred to the gradient magnetic field coil 31 for each protocol may be (and typically are) different, the heat quantity/temperature generated in the gradient magnetic field coil 31 by each protocol also differs. Here, in this example, the order inputted by the operator is (1) FSE, (2) SE, (3) MRA and (4) EPI, and this sequence is stored in the memory circuit of main control circuit 23 (Step S4).

After setting of the study and protocols is completed, main control circuit 23 reads the more detailed actual protocol information of FSE set as a first protocol from the memory circuit, changes it into the pulse sequence information for FSE, and transfers it to the sequence control circuit 24. The sequence control circuit 24 forms the pulsed current waveform signals supplied to gradient magnetic field coil 31, and stores the current waveform in heat quantity memory circuit 27 in heat quantity calculation part 9. Heat quantity calculation circuit 29 calculates the heat quantity/temperature generated in gradient magnetic field coil 31 based on the electrical current waveform signal and the stored temperature of gradient magnetic field coil 31 in heat quantity memory circuit 27 (Step S5). The stored temperature is preferably measured just before imaging as described above. The calculation method is as described below.

The heat quantity generated near gradient magnetic field coil 31 may be classified as two types: (1) the heat quantity (J) generated in a wire of the gradient magnetic field coil 31 according to IR (i.e., resistive) electrical heating of the coil wire itself and; (2) the heat quantity (K) generated by eddy currents induced in the shield structure because of the rapidly changing gradient magnetic field of coil 31 which is located near the shield structure. When respective pulse current waveforms are supplied from gradient magnetic field power supply 25 to the three gradient magnetic field coils 31 as Ax (t), Ay (t), Az (t), the heat quantity (J) generated near gradient magnetic field coil 31 can be described by the following formula:

$$J(t) = Cx(T) \cdot Ax^2(t) + Cy(T) \cdot Ay^2(t) + Cz(T) \cdot Az^2(t) \qquad (1)$$

The respective coil heat quantities Cx, Cy, and Cz depend on respective resistances namely, electric resistance of the coils and heat resistance (conductance). The electric resistance increases in proportion to absolute temperature (T), and although it may depend on X, Y, Z channels, it is approximately 100 to 300 mΩ. The heat resistance (conductance) depends on the type of materials used, such as copper (360 W/mK thermal conductivity) and resin (0.2 W/mK thermal conductivity), however the heat resistance can be ascertained by experiment or computer simulation. By these methods, Cx (T0), Cy (T0) and Cz (T0) are obtained for a normal temperature (T0), and are stored in heat quantity memory circuit 27 of heat quantity calculation part 9 at the time of shipment of the MRI apparatus. Thus, when Ax (t), Ay (t) and Az (t) are inputted into heat quantity calculation circuit 29 from sequence control circuit 24, formula (1) is calculable. On the other hand, the heat quantity (K) generated by eddy currents in the RF shield structure is shown below.

$$K(t)=dx \cdot fx(t)+dy \cdot fy(t)+dz \cdot fz(t) \tag{2}$$

Dx, dy and dz are the resistance elements related to heat transportation, and fx, fy and fz represent the intensity of eddy currents specified by the attenuation time constant τ of the RF shield from the inputted electrical current waveform to the coil. Heat transportation (conductance) is as disclosed in Japanese Patent No. #3110115. Since the heat quantity shown in formulas (1) and (2) are independent, the total heat quantity Q1 (t) generated from the gradient magnetic field coil 31 is the sum as shown below:

$$Q1(t)=J(t)+K(t) \tag{3}$$

In the meantime, when the temperature measured by temperature sensor 39 is T0, an initial heat quantity P0 is shown below.

$$Po=S \cdot To \tag{4}$$

Figure 4:
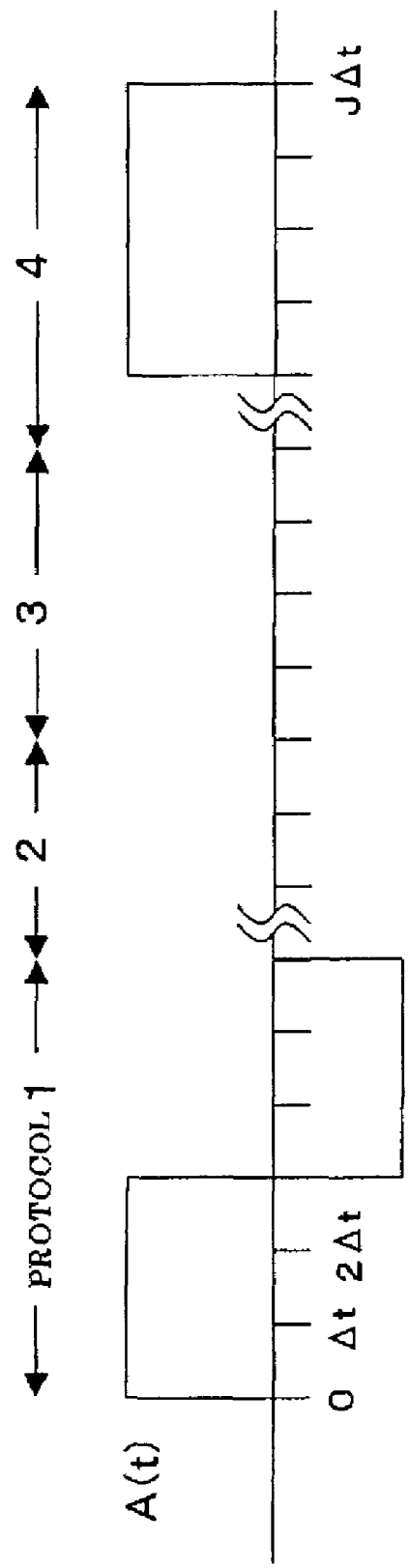
FIG. 4 is a view showing a current waveform supplied to the gradient magnetic field coil in the first embodiment.

Here, S is the heat capacity of gradient magnetic field coil 31. The heat capacity can be approximately calculated based on the weight of each material, such as the resin whose specific heat is about 1.4 kJ/kg·K, and copper wire whose specific heat is about (0.385 kJ/kg·K). FIG. 4 shows a typical current waveform supplied to the gradient magnetic field coil 31, and current data used for calculating is obtained by J samplings at intervals of Δt. The current waveform A (t) of the gradient magnetic field coil 31 is sampled at intervals of Δt. If it is assumed that influence of the cooling system 10 is zero, then accumulated heat quantity Qo (Δt) and temperature T (Δt) in the gradient magnetic field coil 31 after the start of imaging by Δt is approximately as shown below.

$$Qo(\Delta t)=Q1(\Delta t)+Po$$

$$Q1(\Delta t)=J(\Delta t)+K(\Delta t)$$

$$T(\Delta t)=Qo(\Delta t)/S \tag{5}$$

When the cooling liquid temperature at the input end of cooling system 10 is Tin (Δt) and the cooling liquid temperature at the output end is Tout (Δt), Tin (Δt) is equal to T (Δt). Tout (t) is determined by the characteristics of the cooling system 10, and is usually a fixed value (Tc). Therefore, the heat quantity Qf (Δt) removed by the cooling system 10 is as shown below.

$$Qf(\Delta t)=k(T(\Delta t)-Tc) \tag{6}$$

Here, k is a constant determined based on the amount of cooling liquid flowing through cooling pipe 40 within Δt time and its specific heat. The amount and the specific heat are uniquely determined by characteristics of cooling system 10. When the accumulated heat quantity Qo at Δt in formula (5) to the heat quantity Qf (Δt) removed by the cooling system 10 in formula (6) is subtracted and Q1 newly generated after 2Δt is added, it is approximately the remaining or net accumulated heat quantity Qo (2Δt) in the gradient magnetic field coil 31 after 2Δt. That is, Qo (2Δt) is as shown below:

$$Qo(2\Delta t)=Qo(\Delta t)-Qf(\Delta t)+Q1(2\Delta t) \tag{7}$$

Similarly, the accumulated net heat quantity Qo (3Δt) after 3Δt is as shown below.

$$Qo(3\Delta t)=Qo(2\Delta t)-Qf(2\Delta t))+Q1(3\Delta t) \tag{8}$$

In this manner, Qo (4Δt) or for any subsequent n elapsed time intervals nΔt can be calculated in advance. A CPU in heat quantity calculation circuit 29 of the exemplary embodiment performs the above mentioned calculations, and the resulting net remaining heat quantities Qo (Δt) to Qo (JΔt) are stored in heat quantity memory circuit 27 via heat quantity calculation circuit 29. The calculation result may be displayed on TV monitor of display part 21 with alarming level Qar and aborting level Qab stored in heat quantity memory circuit 27 via main control circuit 23.

In this case, although only the maximum result among J calculation results is displayed, a whole or a part of J calculation results may be displayed as a time series of data, such as a graph, in order to let the operator know the process trend of the calculations (Step S6). The CPU of heat quantity calculation circuit 29 compares the remaining or net heat quantity Qo (Δt) through Qo (JΔt) of gradient magnetic field coil 31 to alarming level Qar or aborting level Qab, and display part 21 displays comparison results on the TV monitor. Specifically, the CPU of heat quantity calculation circuit 29 reads out the heat quantities Qo (Δt) through Qo (JΔt) of the gradient magnetic field coil 31 stored in heat quantity memory circuit 27, and extracts maximum Qmax (Step S7). The CPU reads out aborting level Qab from heat quantity memory circuit 27, and Qmax is compared to Qab (Step S8). When Qmax is below Qab, the Qmax is compared to alarming level Qar read out from heat quantity memory circuit 27. When Qmax is below Qar, display part 21 displays that it is possible to image the patient with the set study and protocol, then the prediction of accumulated heat quantity before imaging is completed and CPU waits for a next instruction by the operator (Step S11). When Qmax exceeds Qar, heat quantity calculation circuit 29 orders display part 21 to display the alarm (Step S10), and then prediction of the heat quantity before imaging is completed (Step S11). The alarming level Qar exists since the remaining net accumulated heat quantity obtained by predictive calculation may be different from the net heat quantity accumulated in actual imaging. If the alarm is displayed on the TV monitor, the operator may determine whether to start imaging or not. When Qmax exceeds Qab, the operator may change the order or an inter-protocol time margin of the protocols (Step S12), and it returns to Step S5 where the same calculation of net accumulated heat quantity as above is performed.

Figure 5:
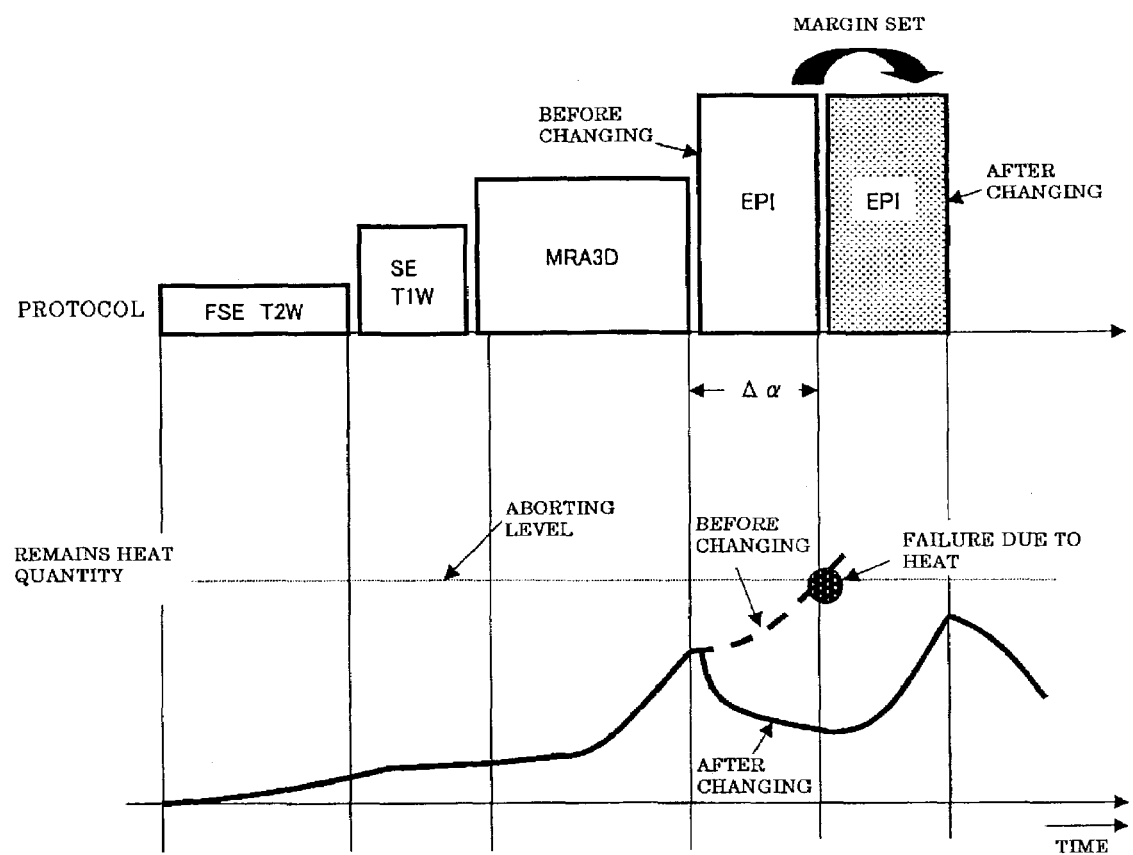
FIG. 5 is a graph showing heat quantity when a protocol is postponed in the first embodiment.

FIG. 5 shows an example of net heat quantity when the operator inserts an inter-protocol time margin between protocols (postpones the net protocol) and Qmax is suppressed under aborting level Qab. On the upside of FIG. 5, the protocols are re-set in the order of FSE (T2 enhancement), SE (T1 enhancement), MR angiography (3 dimensions), and EPI. The horizontal axis of each protocol indicates the imaging period, and the vertical axis of each protocol indicates the intensity of the current to be supplied to gradient magnetic field coil 31. On the downside of FIG. 5, a time change of the remaining heat quantity in gradient magnetic field coil 31 is shown. In this case, when EPI imaging protocol is set after an MR angiography protocol, the remaining heat quantity is over the aborting level Qab according to the pre-imaging calculation. Therefore, the EPI imaging protocol is postponed for $\Delta\alpha$ after the MRI angiography to prevent Qmax from exceeding aborting level Qab.

Figure 6:
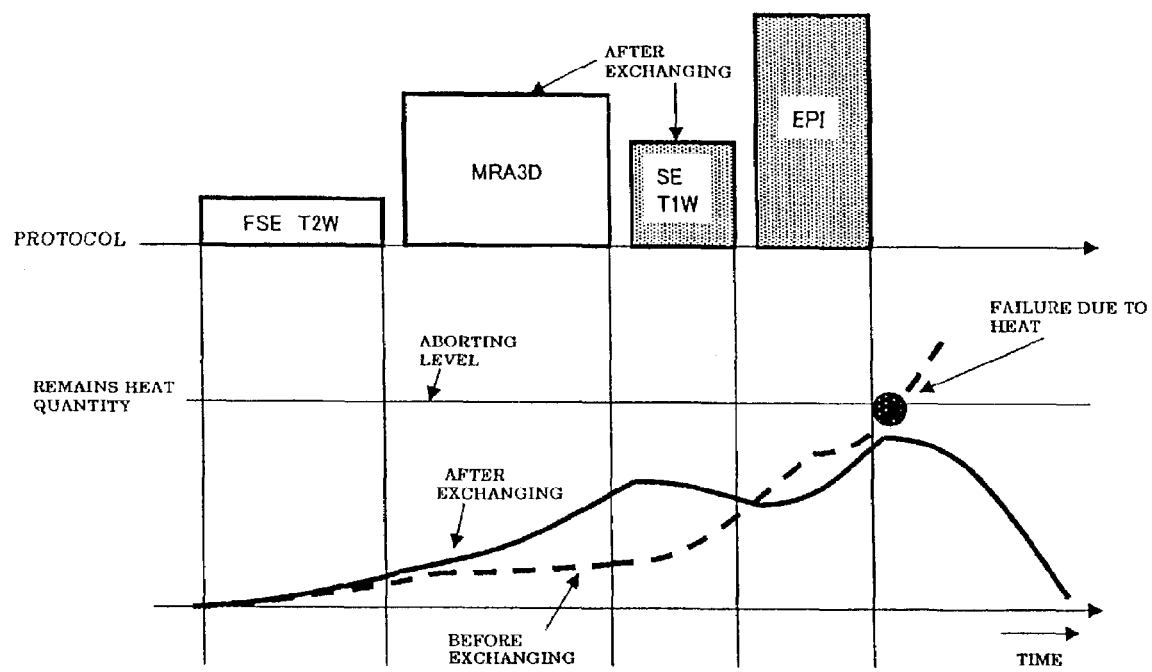
FIG. 6 is a graph showing heat quantity when the order of protocols is changed in the first embodiment.

Similarly, FIG. 6 shows an example of the heat quantity when the order of protocols is changed and Qmax is suppressed under aborting level Qab. The upside graph shows the sequential order of the protocols and the downside graph shows the change vs time of the remaining heat quantity in gradient magnetic field coil 31. In this case, the operator may change the order of SE (T1 enhancement) and MR angiography (3 dimensions) shown in FIG. 5 to prevent Qmax from exceeding aborting level Qab. Thus, when the prediction calculation result of the net remaining heat quantities of gradient magnetic field coil 31 exceeds aborting level Qab, the operator may exchange the order of protocols, or may insert extra time margin between the protocols via input part 22.

Although the exchange or insertion of margin for the protocols may be automatically performed based on the heat quantity calculation result in part 9, it is desirable that the operator makes the final decision. If the calculation result still exceeds aborting level Qab even after a change of protocol order and the insertion of margin time, the operator may yet exchange the studies via input part 22, and the net remaining heat quantities are re-calculated (Step S13).

Figure 7:
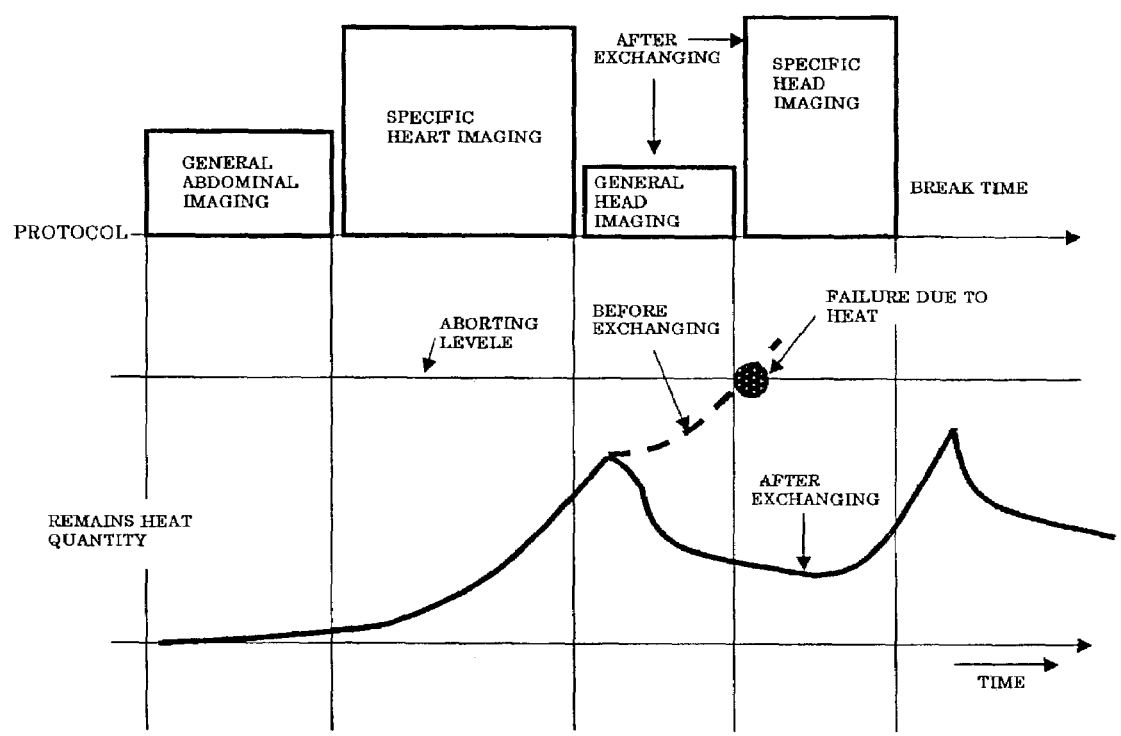
FIG. 7 is a graph showing heat quantity when the order of studies is changed in the first embodiment.

FIG. 7 shows an example of net heat quantity when the operator changes the order of the studies and Qmax is suppressed under aborting level Qab. The upside of FIG. 5 shows the order of the studies and the downside shows time changes in the net remaining heat quantity in gradient magnetic field coil 31. The studies may be set in an order of general abdominal imaging for a first patient, specific heart imaging for a second patient, general head imaging for a third patient, specific head imaging for a forth patient. In this case, the predicted net accumulated heat quantity shown by the broken line of FIG. 7 exceeds aborting level Qab at the end of the specific head imaging for the third patient. The general head imaging and the specific head imaging protocols are then exchanged to prevent Qmax from exceeding the aborting level Qab.

According to the first embodiment as described above, the operator can know the predicted accumulated heat quantity of gradient magnetic field coil 31 before imaging. Moreover, since the study or the protocol then can be changed before imaging to suppress the net accumulated heat quantity below aborting level Qab, the MRI apparatus can be prevented from suffering failure before imaging.

A second embodiment of the present invention will be explained, referring to FIG. 8 and FIG. 9 which are a flow chart showing a calculation procedure and a graph of the order of the protocols and the heat quantity, respectively. Although the accumulated heat quantity of gradient magnetic field coil 31 is calculated based on a similar calculation to the first embodiment, an actual temperature of the gradient magnetic field coil 31 now also is measured during imaging to re-calculate the net accumulated heat quantity in the second embodiment. As described above, actual temperature is measured by a thermometer provided on the surface of resin 38 surrounding gradient magnetic field coil 31. However, since the heat conductivity of resin 38 is relatively low, it takes some dozens of seconds for actual coil temperature to reach the thermometer. That is to say, the thermometer really measures the temperature resulting from execution of previous protocols. That is, there is large time lag between the measured temperature and the actual coil temperature. Therefore, the operator may not timely notice the temperature as being too high and the MRI apparatus may be damaged.

Figure 8:
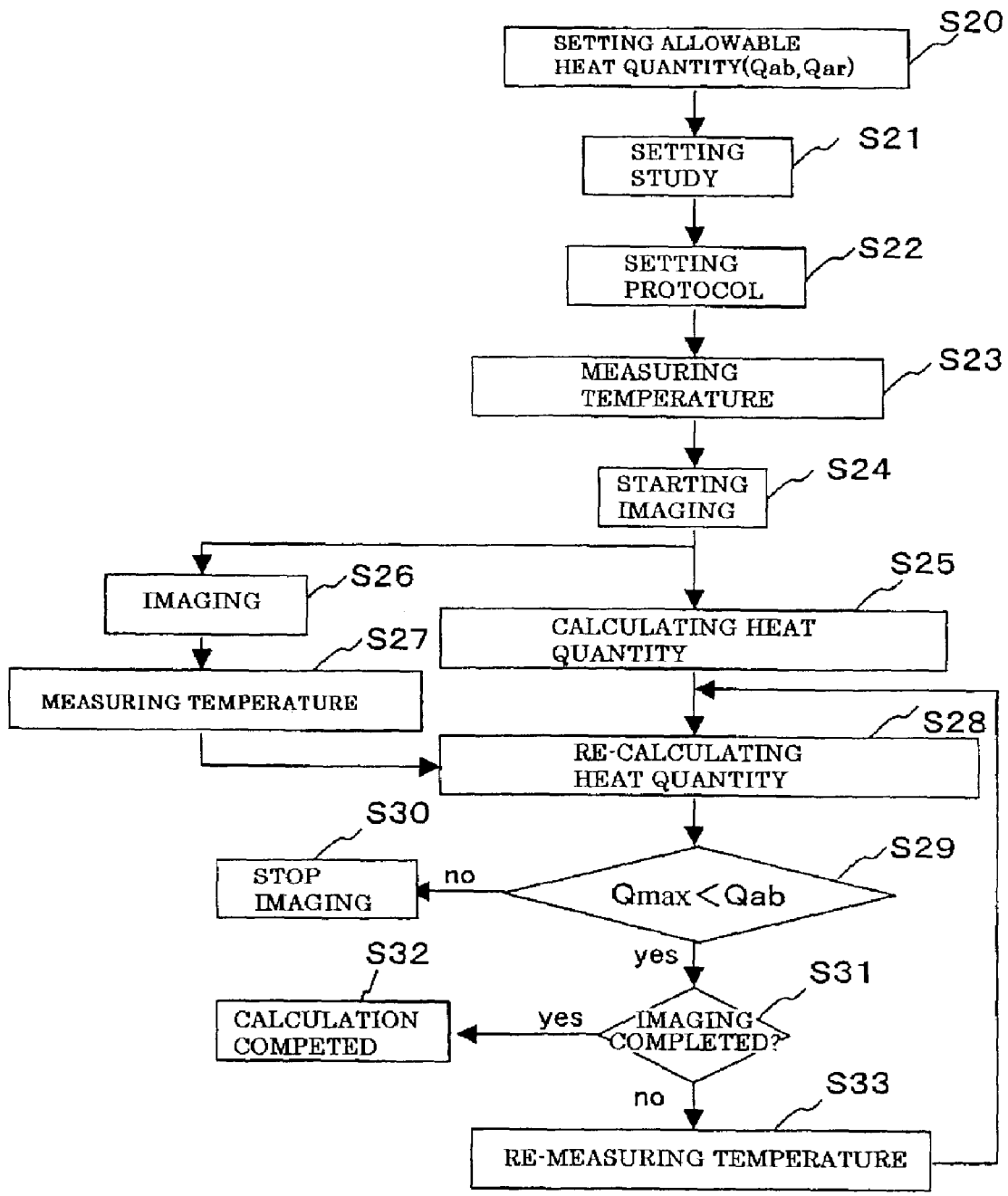
FIG. 8 is a flow chart showing a calculation procedure for the second embodiment.
Figure 9:
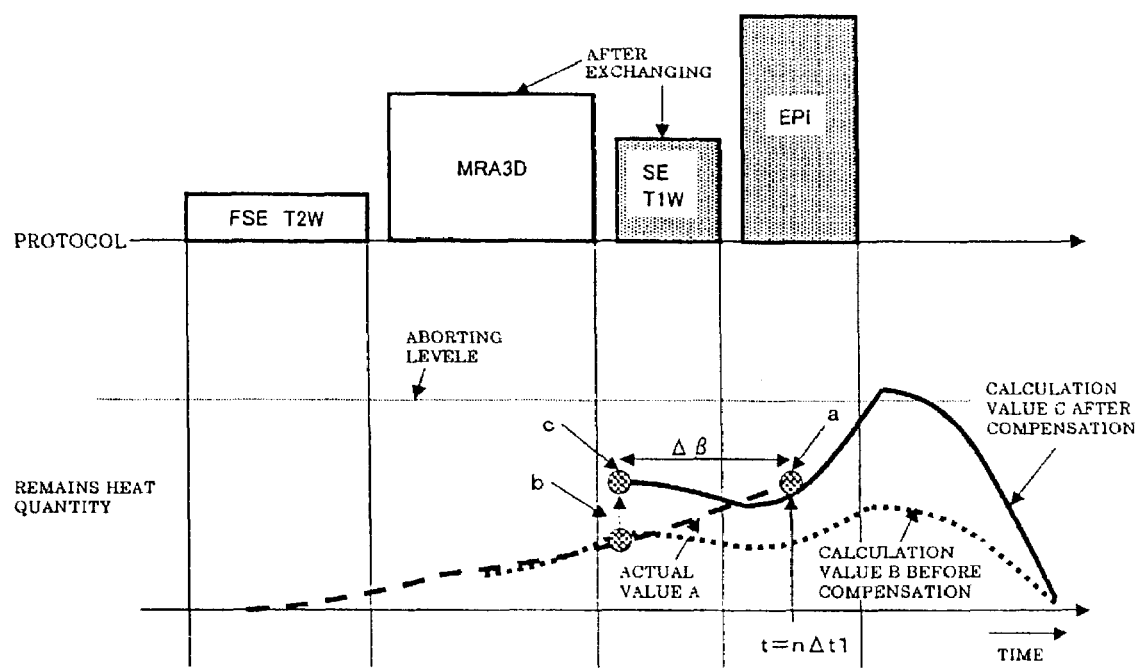
FIG. 9 is a graph showing heat quantity when the heat quantity is compensated in the second embodiment.

In FIG. 8, the allowable heat quantity of the gradient magnetic field coil 31 may be set, and heat quantity memory circuit 27 stores the allowable heat quantity similar to the operation of the first embodiment (Step S20). And also, the study and protocols may be set and stored in heat quantity memory circuit 27. The protocols are set in the illustrated example in the order of FSE (Fast spin echo) T2 enhancement, 3-dimensional MR angiography, SE (spin echo) T1 enhancement, and EPI (echo planar imaging) for general head imaging similar to the first embodiment (Step 21 and 22). Temperature sensor 39 near gradient magnetic field coil 31 measures the temperature of gradient magnetic field coil 31. In this case also, a semiconductor element, such as a thermocouple or a thermometer may be used as the temperature sensor. The temperature detector 28 of heat quantity calculation part 9 changes measured temperature data into a digital signal to be stored by heat quantity memory circuit 27 (Step S23).

After the initial set-up but before imaging is completed, the operator may input an imaging start command in input part 22 (Step S24). The MRI apparatus then images the patient and calculates the heat quantity in parallel (Step S25 and S26). The protocol information inputted via input part 22 is transferred to main control circuit 23. Main control circuit 23 changes protocol information to the pulse sequence information, such as intensity, period and timing of pulse current, and transfers it to sequence control circuit 24. Sequence control circuit 24 sends the pulse sequence control signal to gradient magnetic field power supply 25, transmitter 17, and receiver 18. Gradient magnetic field power supply 25 sets the pulse current of the three gradient magnetic field coils 31, and sets the gradient magnetic field in a slice, phase, readout directions according to the pulse sequence control signal. Similarly, transmitter 17 sets the frequency and phase of the RF pulse transferred to transmitter coil 15 according to the pulse sequence control signal.

Sequence control circuit 24 drives the three gradient magnetic field power supplies 25 according to the pulse sequence control signal, and gradient magnetic field power supplies 25 supplies pulse current to gradient magnetic field coil 31. Transmitter 17 supplies pulse current to transmitter coil 15. Receiver 18 performs signal processing, such as intermediate frequency transforming, phase detecting, filtering, and A/D converting. Reconstruction circuit 19 performs 2-dimensional Fourier transform of MR signals sent from the receiver 18 via sequence control circuit 24, and reconstructs an image (MR image) of real space. Memory circuit 20 stores the MRI image reconstructed by reconstruction circuit 19, and display part 21 displays the image via main control circuit 23.

In parallel to MRI imaging, temperature sensor 39 near the gradient magnetic field coil 31 repeatedly measures the temperature of gradient magnetic field coil 31 at specified time intervals, and sends the temperature data to heat quantity calculation circuit 29 via temperature detector 28. (Step S27). Sequence control circuit 24 sends waveform information for the pulse current waveform supplied to gradient magnetic field coils 31 to heat quantity calculation circuit 29. Current waveform information is stored in sequence control circuit 24 until imaging is completed.

Current waveform information is stored through heat quantity calculation circuit 29 in heat quantity memory circuit 27. Therefore, it is possible to more timely calculate the predicted net remaining heat quantity by heat quantity calculation circuit 29 even before the delayed actually measured temperature becomes available during imaging. Heat quantity calculation circuit 29 calculates the heat quantity generated in gradient magnetic field coil 31 based on the actual temperature measured by temperature sensor 39 at specified time intervals ($\Delta t1$) and also based on current waveform information for gradient magnetic field coil 31 sent from sequence control circuit 24 (Step S25). The calculation method will be described below. When respective pulse current waveforms supplied from gradient magnetic field power supply 25 to the three gradient magnetic field coils 31 are Ax (t), Ay (t), Az (t), the heat quantity (J) generated from the gradient magnetic field coil 31 is as below.

$$J(t) = Cx \cdot Ax^2(t) + Cy \cdot Ay^2(t) + Cz \cdot Az^2(t) \tag{9}$$

When the Ax (t), Ay (t) and Az (t) are inputted into the heat quantity calculation circuit 29 from sequence control circuit 24, formula (9) is calculable. On the other hand, the heat quantity (K) generated by eddy currents in the shield structure are as shown below:

$$K(t) = dx \cdot fx(t) + dy \cdot fy(t) + dz \cdot fz(t) \tag{10}$$

Since the heat quantity shown in formulas (9) and (10) are independent, the total heat quantity Q1 (t) generated from gradient magnetic field coil 31 is the sum as shown below:

$$Q1(t) = J(t) + K(t) \tag{11}$$

In the meantime, when t=t1 and the temperature measured by temperature sensor 39 is T0 ($\Delta t1$), an initial heat quantity P0 ($\Delta t1$) is as shown below:

$$Po(\Delta t1) = S \cdot To(\Delta t1) \tag{12}$$

The current waveform A (t) of gradient magnetic field coil 31 is sampled at intervals of $\Delta t$ and the starting point $t = \Delta t1$. If it is assumed that influence of cooling system 10 is zero, the net remaining heat quantity Qo ($\Delta t$) and temperature T ($\Delta t$) in gradient magnetic field coil 31 after the start of imaging by $\Delta t$ is approximately shown as below:

$$Qo(\Delta t) = Q1(\Delta t) + Po(\Delta t1)$$

$$Q1(\Delta t) = J(\Delta t) + K(\Delta t)$$

$$T(\Delta t) = Qo(\Delta t)/S \tag{13}$$

When the cooling liquid temperature at the input end of cooling system 10 is Tin ($\Delta t$) and the cooling liquid temperature of the output end is Tout ($\Delta t$), Tin($\Delta t$) is equal to T ($\Delta t$). Tout (t) is determined by characteristics of cooling system 10, and is usually a fixed value (Tc). Therefore, the heat quantity Qf ($\Delta t$) removed by cooling system 10 is as shown below:

$$Qf(\Delta t) = k(T(\Delta t) - Tc) \tag{14}$$

Here, k is a constant determined based on the amount of flowing cooling liquid and its specific heat, and both are uniquely determined by characteristics of cooling system 10. When the net heat quantity Qo at $\Delta t$ shown in the formula (13) to the heat quantity Qf ($\Delta t$) removed by cooling system 10 shown in formula (14) is subtracted and Q1 newly generated after $2\Delta t$ is added, it is approximately the net remaining heat quantity Qo ($2\Delta t$) in gradient magnetic field coil 31 after $2\Delta t$. That is, the Qo ($2\Delta t$) is as shown below:

$$Qo(2\Delta t) = (Qo(\Delta t) - Qf(\Delta t)) + Q1(2\Delta t) \tag{15}$$

Similarly, the remaining heat quantity Qo ($3\Delta t$) after $3\Delta t$ is shown as below:

$$Qo(3\Delta t) = (Qo(2\Delta t) - Qf(2\Delta t)) + Q1(3\Delta t) \tag{16}$$

In this manner, Qo ($4\Delta t$) or the net heat values at subsequent times can be calculated. When the temperature T0 ($2\Delta t1$) measured by temperature sensor 39 T=$2\Delta t1$ is inputted into heat quantity calculation circuit 29 via temperature detector 28, $\Delta t1$ in the formulas (12) and (13) is changed to $2\Delta t1$. Moreover, formulas (9) through (16) are re-calculated on the time-axis ($\Delta t$, $2\Delta t$, etc.) where the starting point for calculation is t=$2\Delta t1$ (Step S28). The successive calculations required due to determine Q and A are functions of temperature itself, because electric resistance is proportional to absolute temperature and the heat quantity Qf($\Delta t$) removed by the cooling system 10 is proportional to the difference in temperature between the coolant and the gradient coil body.

As described above, since the temperature of gradient magnetic field coil 31 is measured on the surface of resin 38, the actual remaining heat quantity is only detected after some dozens of seconds. For this reason, it is desirable to compensate for the time delay. FIG. 9 shows a method for correcting for the time delay when the study is general head imaging. On the upside of FIG. 9, the order of protocols is shown, and on the downside, actual heat quantity A (converted from the temperature) of gradient magnetic field coil 31, calculated heat quantity B before correcting, and calculated heat quantity B after correcting are shown. The time delay $\Delta \beta$ can be experimentally obtained and is stored in quantity memory circuit 27. The time delay may be set at the time of shipment or installation of the MRI apparatus.

Thus, temperature sensor 39 detects the temperature at a point (t=n$\Delta t1$) where the newest actual temperature is measured, and the newest actual temperature is inputted to heat quantity calculation circuit 29 via temperature detector 28. Heat quantity calculation circuit 29 re-calculates heat quantity, going back to a point before the $\Delta \beta$. In this way, the remaining heat quantity is compensated from a calculation value B to value C. In addition, when the calculation value C after compensation is displayed, calculation value B before compensation may be removed from display part 21. Heat quantity calculation circuit 29 stores the calculation result of the remaining heat quantity Qo ($\Delta t$) to Qo (J$\Delta t$) obtained from the above-mentioned calculation in heat quantity memory circuit 27. The calculation results are further displayed on display part 21 with alarming level Qar and aborting level Qab via the main control circuit 23 as the time change of the remaining heat quantity. Heat quantity calculation circuit 29 repeatedly calculates the remaining heat quantity using the above formulae, as an initial temperature is measured by the time interval $\Delta t1$ (Step S28 and S33). In this process, the operator may observe the calculated remaining heat quantity of gradient magnetic field coil 31 displayed on display part 21, and when there is a possibility that this value exceeds aborting level Qab, the operator may input an imaging stop command via input part 22 (Step S29). The input part 22 sends this imaging stop command to main control circuit 23, and main control circuit 23 stops pulse current to gradient magnetic field coil 31 and transmitter coil 15 thus causing a stop to the imaging process. (Step S30). On the other hand, when MR imaging is completed and there is no possibility that calculated heat quantity exceeds aborting level Qab, main control circuit 23 completes calculation of the remaining heat quantity (Steps S31 and S32).

According to the second embodiment, since remaining heat quantity of gradient magnetic field coil 31 is calculated during imaging based on the actual heat quantity obtained from the temperature measured by a predetermined time delay interval, more timely and accurate measurement and/or prediction of heat quantity can be obtained. Thus, in the second embodiment, since the time delay in the temperature sensor 39 is compensated, it is possible to react more quickly to stop a prospective failure in advance.

The present invention is not limited to the above exemplary embodiments, but, rather includes modifications and variations that may be made without departing from the spirit or scope of the general inventive concepts. For example, although the graph displayed on display part 21 shows heat quantity in exemplary embodiments, it may be changed to a temperature graph. Further the temperature sensor is not limited to be a thermocouple.

As described above, according to the present invention, it is possible to better prevent the MRI apparatus from being damaged because of heat generated in the gradient coil sub-system of an MRI system.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A magnetic resonance imaging apparatus, said apparatus comprising:
   a gradient magnetic field coil configured to generate a gradient magnetic field for an object;
   an RF shield board configured to shield an RF field of a whole body RF coil;
   an input device configured to input MRI pulse sequence protocol information;
   a controller configured to control current supplied to the gradient magnetic field coil based on the inputted protocol information; and
   a calculator configured to calculate the quantity of heat of the gradient field coil based on heat generated by current supplied or to be supplied to the gradient magnetic field coil and generated by eddy currents induced or to be induced in the RF shield board.

2. The magnetic resonance imaging apparatus of claim 1 further comprising:
   a temperature sensor configured to measure temperature of the gradient magnetic field coil,
   wherein the calculator calculates the quantity of heat based at least in part on the temperature measured by the temperature sensor.

3. The magnetic resonance imaging apparatus of claim 2 further comprising:
   a cooler configured to cool the gradient magnetic field coil,
   wherein the calculator calculates a net quantity of heat based at least in part on removal of heat from the coil by the cooler.

4. The magnetic resonance imaging apparatus of claim 3 wherein:
   the temperature sensor repeatedly measures the temperature of the gradient magnetic field coil during MR imaging.

5. The magnetic resonance imaging apparatus of claim 4 further comprising:
   a memory configured to store a time delay associated with the temperature sensor,
   wherein the calculator calculates the quantity of heat as the temperature is measured at a time before the stored time delay.

6. The magnetic resonance imaging apparatus of claim 4 further comprising:
   a display unit configured to display the quantity of heat and the temperature repeatedly measured as a time series of data.

7. The magnetic resonance imaging apparatus of claim 4 further comprising:
   a memory configured to store a threshold value; and
   a comparator configured to compare the quantity of heat to the threshold value, wherein the controller stops supplying current to the gradient magnetic field coil if the quantity of heat exceeds the threshold value.

8. The magnetic resonance imaging apparatus of claim 4 further comprising:
   a memory configured to store a threshold value; and
   a comparator configured to compare the quantity of heat to the threshold value, wherein the controller generates an alarm when the quantity of heat exceeds the threshold value.

9. The magnetic resonance imaging apparatus of claim 3, wherein:
   the temperature sensor measures the temperature of the gradient magnetic field coil before an MR imaging sequence is started.

10. The magnetic resonance imaging apparatus of claim 9 further comprising:
    a display unit configured to display the quantity of heat as a time series of data.

11. The magnetic resonance imaging apparatus of claim 9 further comprising:
    a memory configured to store a threshold value; and
    a comparator configured to compare the quantity of heat to the threshold value.

12. The magnetic resonance imaging apparatus of claim 11 wherein:
    the input device is configured to change the inputted protocol information when the quantity of heat exceeds the threshold value.

13. The magnetic resonance imaging apparatus of claim 12 wherein:
    the input device is configured to change an elapsed period of time between the protocols.

14. The magnetic resonance imaging apparatus of claim 12 wherein:
    the input device is configured to change an order of the protocols.

15. A method for calculating heat quantity in a magnetic resonance imaging apparatus, said method comprising:
    generating a gradient magnetic field for an object;
    shielding an RF current of a whole body RF coil;
    inputting MRI pulse sequence protocol information;
    controlling current supplied to the gradient magnetic field coil based at least in part on the inputted protocol information; and
    calculating the quantity of heat of the gradient magnetic field coil based on heat generated by current supplied or to be supplied to the gradient magnetic field coil and generated by eddy currents induced or to be induced by shielding the RF current.

* * * * *